US008922409B2

(12) United States Patent
Tao et al.

(10) Patent No.: US 8,922,409 B2
(45) Date of Patent: Dec. 30, 2014

(54) SWITCH-DRIVING CIRCUIT AND DAC USING THE SAME

(71) Applicant: MediaTek Singapore Pte. Ltd., Singapore (SG)

(72) Inventors: Cheng Tao, He Fei (CN); Yue Feng, Hefei (CN); Kun Lan, Hefei (CN); Yu-Kai Chou, Hsinchu (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/836,216

(22) Filed: Mar. 15, 2013

(65) Prior Publication Data

US 2013/0314262 A1  Nov. 28, 2013

(30) Foreign Application Priority Data

May 25, 2012  (CN) .......................... 2012 1 0166673

(51) Int. Cl.
*H03M 1/00* (2006.01)
*H03K 3/356* (2006.01)
*H03M 1/66* (2006.01)
*H03K 3/01* (2006.01)

(52) U.S. Cl.
CPC ............ *H03K 3/01* (2013.01); *H03K 3/356182* (2013.01); *H03M 1/66* (2013.01)
USPC ............ 341/136; 341/135; 341/144; 341/153

(58) Field of Classification Search
CPC ..... H03M 1/745; H03M 1/66; H03M 1/0845; H03M 3/356
USPC .................................. 341/136, 144, 135, 153
See application file for complete search history.

(56) References Cited

U.S. PATENT DOCUMENTS

| 6,424,278 | B1 * | 7/2002 | Groeneweg | 341/120 |
|---|---|---|---|---|
| 6,674,382 | B1 * | 1/2004 | Jordan | 341/144 |
| 6,927,714 | B1 * | 8/2005 | Teterwak | 341/136 |
| 7,202,744 | B1 * | 4/2007 | Manganaro | 330/296 |
| 7,456,767 | B2 * | 11/2008 | Abe et al. | 341/135 |
| 7,701,370 | B2 * | 4/2010 | Lee | 341/135 |
| 7,701,377 | B1 * | 4/2010 | Cyrusian | 341/163 |
| 7,907,074 | B2 * | 3/2011 | Zanchi et al. | 341/155 |

(Continued)

FOREIGN PATENT DOCUMENTS

| GB | 2 333 191 | 7/1999 |
|---|---|---|
| GB | 2 379 107 | 2/2003 |

*Primary Examiner* — Linh Nguyen
(74) *Attorney, Agent, or Firm* — McClure, Qualey & Rodack, LLP

(57) ABSTRACT

A switch-driving circuit and a Digital-to-Analog Converter (DAC) using the switch-driving circuit are provided. The switch-driving circuit includes a main cell and a reference cell. The main cell includes a current source and a resistance-control component electronically connected to the current source. The reference cell is coupled to the current source and the resistance-control component, and includes a first loop, the first loop is configured to track a target reference voltage so as to provide at least one first control voltage to control a resistance change of the resistance-control component. The reference cell and the main cell are implemented by MOS transistors in place of capacitors which occupy an increased circuit area, rendering reduced circuit area for the switch-driving circuit, and decreasing manufacturing costs. Further, the switch-driving circuit outputs a voltage signal with reduced noise, increasing the performance of the Digital-to-Analog Converter.

19 Claims, 7 Drawing Sheets

(56) References Cited

U.S. PATENT DOCUMENTS

| | | | |
|---|---|---|---|
| 8,013,770 B2* | 9/2011 | Yang et al. | 341/144 |
| 8,390,491 B2* | 3/2013 | Wakimoto | 341/135 |
| 8,587,707 B2* | 11/2013 | Matsumoto et al. | 348/294 |
| 2003/0198237 A1 | 10/2003 | Cranford, Jr. et al. | |
| 2005/0030213 A1* | 2/2005 | May et al. | 341/144 |
| 2005/0073452 A1 | 4/2005 | Manganaro | |
| 2007/0247342 A1 | 10/2007 | Manganaro | |
| 2007/0279270 A1* | 12/2007 | Chida et al. | 341/144 |
| 2011/0050470 A1* | 3/2011 | Kimura | 341/136 |

* cited by examiner

US 8,922,409 B2

SWITCH-DRIVING CIRCUIT AND DAC USING THE SAME

CROSS REFERENCE TO RELATED APPLICATIONS

This application claims priority of China Patent Application No. 201210166673.5, filed on May 25, 2012, and the entirety of which is incorporated by reference herein.

BACKGROUND OF THE INVENTION

1. Field of the Invention

The present disclosure relates to driving circuitries, and in particular to a switch-driving circuit and DAC employing the switch-driving circuit.

2. Description of the Related Art

High-Definition Television (HDTV) and Blu-ray Disc (BD) players have gained immense popularity in the daily life of consumers recently. The HDTV and BD players both employ high-prevision and high-speed Digital-to-Analog Converters (DAC) for reconstructing high-quality images or video information.

A switch-driving circuit plays an important part in the DAC. The switch-driving circuit typically comprises a Low Dropout Regulator (LDO) and a core part for the switch-driving circuit. The LDO is employed to provide a stable voltage supply signal VDD2 to the core part for the switch-driving circuit. Nevertheless, since the DAC is operated by digital signals switching on and off to control signal processing, the voltage supply signal VDD2 may be affected by switch noise owned to the signal switching processes, which can affect the performance of the DAC.

In the conventional DAC, the LDO in the switch-driving circuit typically adopts a large capacitor component to suppress the noise. Due to the large area occupied by the capacitor component in the switch-driving circuit, the switch-driving circuit requires an increased circuit area, leading to an increased manufacturing cost for the DAC.

BRIEF SUMMARY OF THE INVENTION

A detailed description is given in the following embodiments with reference to the accompanying drawings.

An embodiment of a switch-driving circuit is described, comprising a main cell and a reference cell. The main cell comprises a current source and a resistance-control component interconnected with the current source. The reference cell is coupled to the current source and the resistance-control component and includes a first loop. The first loop is configured to track a target reference voltage so as to provide a first control voltage to control the resistance of the resistance-control component.

Another embodiment of a Digital-to-Analog Converter is provided, comprising a decoder and a switch-driving circuit connected thereto. The switch-driving circuit includes: a main cell, comprising a current source and a resistance-control component electronically connected to the current source; and a reference cell, coupled to the current source and the resistance-control component, comprising a loop configured to track a target reference voltage so as to provide at least one first control voltage to control a resistance change of the resistance-control component.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

In the specification and subsequent applications, persons with ordinary skill in the art will understand that certain terminology is adopted for certain devices and components, and hardware manufacturers may adopt a different nomenclature to refer to the same devices and components. The scope of the invention is not limited by the names of the devices and components, but limited by the functions of the devices and components that define those devices and components. The phrase "comprise" in the specification and the claims is an open-ended term, encompassing all the elements listed, but may also include additional, unnamed elements. The phrase "couple" includes any directly and indirectly electrically connected means. When a first device is coupled to a second device, it can be understood as meaning that the first device can be connected to the second device directly, or through other means or devices connected to the second device.

A switch-driving circuit is provided. The switch-driving circuit can be adopted in a Digital-to-Analog Converter (DAC). Details for the switch-driving circuit are provided as follows.

Figure 1:
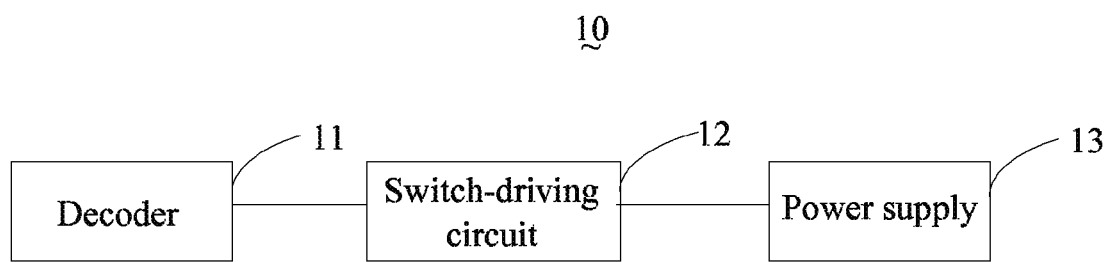
FIG. 1 is a block diagram of a digital-to-analog converter (DAC) according to an embodiment of the invention.
Figure 2:
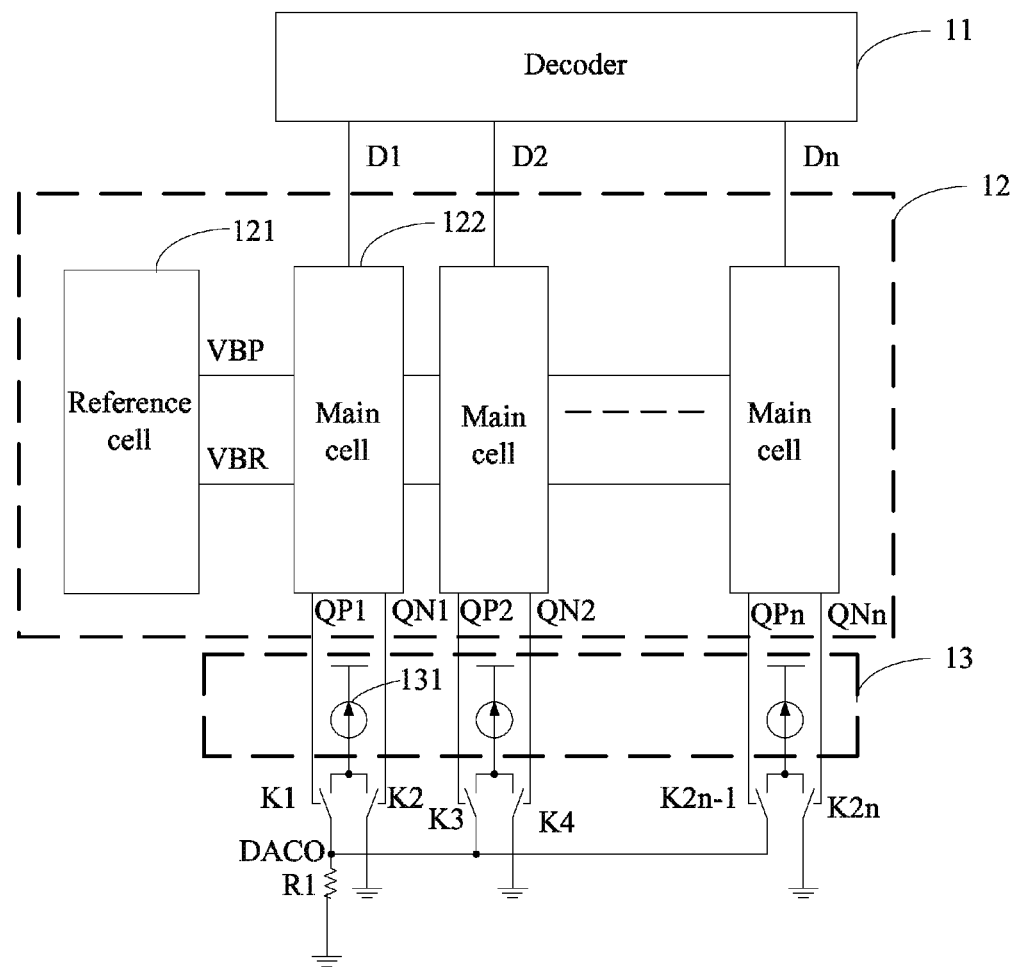
FIG. 2 is a circuit schematic of the DAC of FIG. 1.

FIG. 1 is a block diagram of a DAC 10 according to an embodiment of the invention. FIG. 2 is a circuit schematic of the DAC 10 according to an embodiment of the invention. The DAC 10 includes a decoder 11, a switch-driving circuit 12, and a power supply 13. The decoder 11 is coupled to the switch-driving circuit 12, and the switch-driving circuit 12 is coupled to the power supply 13. The switch-driving circuit 12 includes a reference cell 121 and one or more main cells 122.

As shown in FIG. 2, the switch-driving circuit 12 includes n number of main cells 122, and the decoder 11 can output a plurality of digital signals D1-Dn to the n number of main cells 122. The power supply 14 includes n number of constant current source cells 131. The number of constant current source cells 131 is equal to that of the main cells 122.

In the present embodiment, each main cell 122 can acquire a first control voltage VBP and a second control voltage VBR from the reference cell 121. Each main cell 122 includes two output nodes QP and QN. Particularly, for each main cell 122, an output node QP1 is coupled to a control node of a control switch K1, and an output node QN1 is coupled to a control node of a control switch K2. Output nodes of the corresponding constant current source cells 131 are respectively coupled to the first nodes of the control switches K1 and K2, a second node of the control switch K1 is coupled to one end of a resistor R1, the other end of the resistor R1 is coupled to the ground, and a second node of the control switch K2 is coupled to the ground. The control switch K1 is opened (i.e. turned off) when the output node QP1 outputs a signal "1". The control switch K2 is closed (i.e. turned on) when the output node QN1 outputs a signal "0", rendering the output node DACO of the DAC 10 to output a signal "0". The control switch K1 is closed when the output node QP1 outputs a signal "0". The control switch K2 is opened when the output node QN1 outputs a signal "1", causing the output node DACO of the DAC 10 to output a non-zero voltage. Accordingly, the DAC 10 in the embodiment can control the switch-driving circuit 12 to generate the switch driving signals via the decoder 11, thereby controlling the output voltage, such as the voltage at the output node DACO, of the power supply 13, converting a digital signal output from the decoder 11 into an analog signal.

Figure 3:
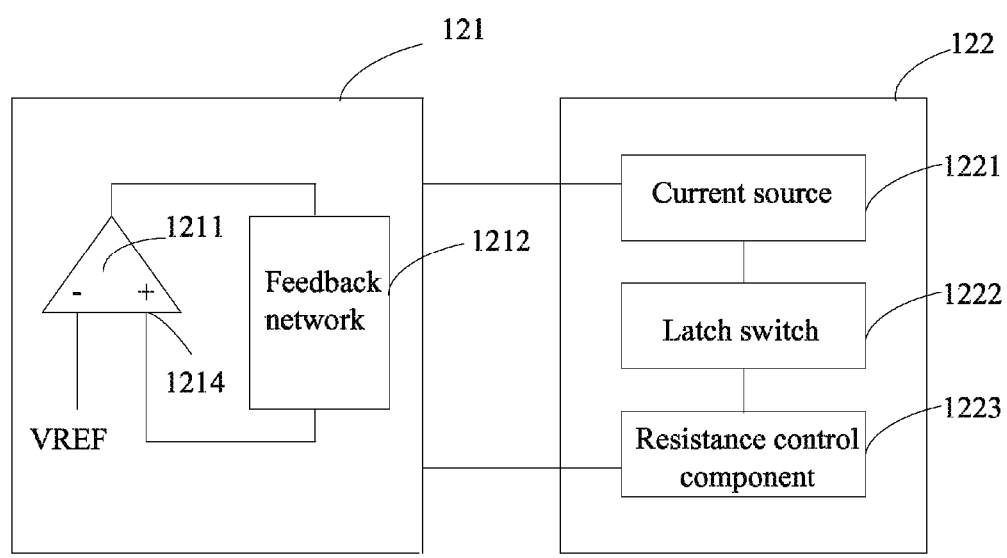
FIG. 3 shows a block diagram of a switch-driving circuit of the DAC shown in FIG. 1, according to an embodiment of the invention.

Please refer to FIG. 3, showing a circuit schematic of the switch-driving circuit 12 in FIG. 1 according to an embodiment of the invention. The main cell 122 in the embodiment includes a current source 1221, a latch switch 1222, and a resistance-control component 1223 connected in serial. The reference cell 121 is coupled to the current source 1221 and the resistance-control component 1223. The reference cell 121 is configured to provide at least one control voltage to the current source 1221 and the resistance-control component 1223 to control the resistance change of the resistance-control component 1223. In the embodiment, the reference cell 121 can provide the first control voltage VBP to the current source 1221, and the second control voltage VBR to the resistance-control component 1223.

The reference cell 121 includes an operational amplifier 1211 and a loop 1212. A target reference voltage VREF is input into a first input node of the operational amplifier 1211. The loop 1212 is configured to adjust the output voltage of the operational amplifier 1121. One end of the loop 1212 is coupled to an output node of the operational amplifier 1211, and the other end of the loop 1212 is coupled to a second input node 1214 of the operational amplifier 1221, thereby tracking the target reference voltage VREF by the voltage fed back to the second input node 1214 of the operational amplifier 1211.

Figure 4:
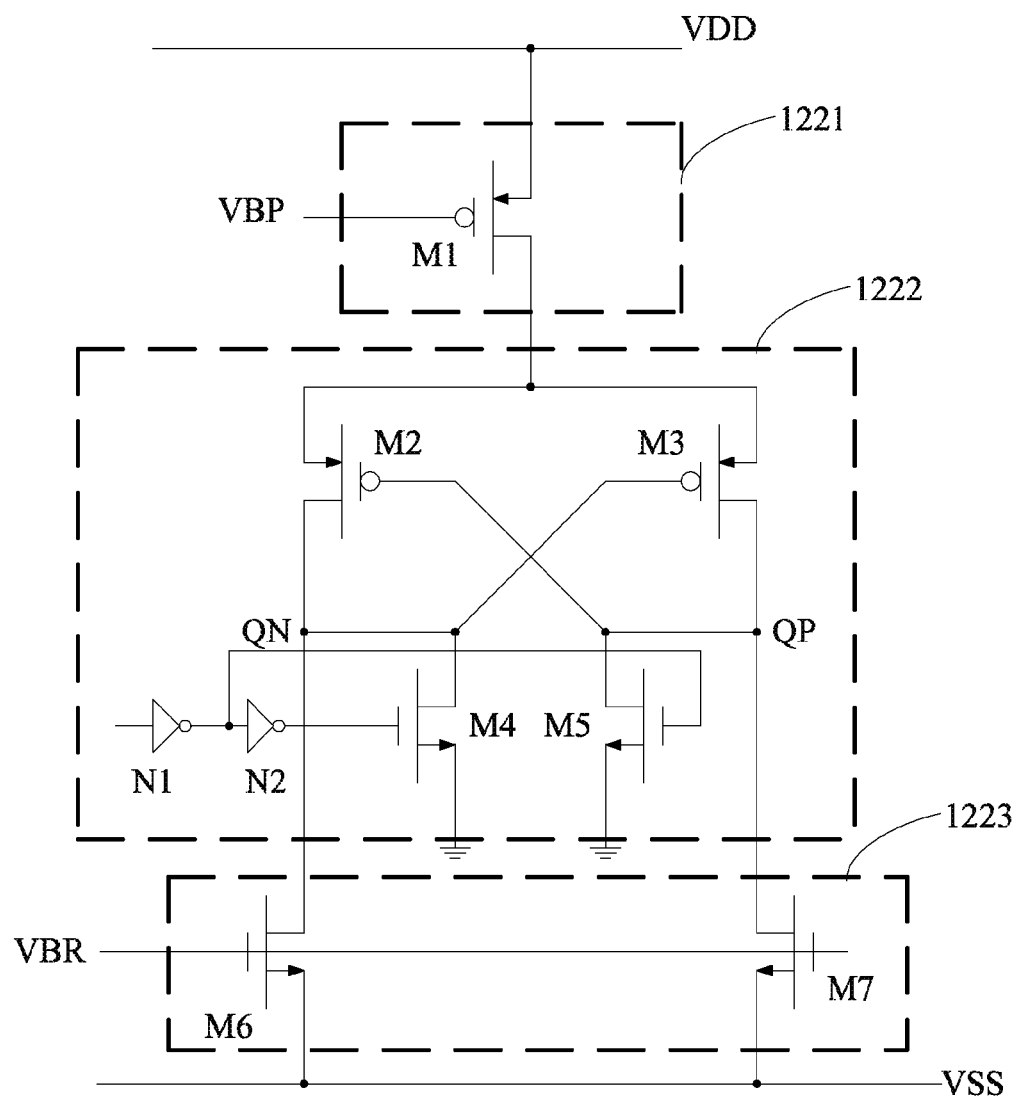
FIG. 4 is a circuit schematic of a main cell of the switch-driving circuit shown in FIG. 3, according to an embodiment of the invention.

FIG. 4 is a circuit schematic of the main cell 122 in FIG. 3 according to an embodiment of the invention. The current of the current source 1221 and the output current of the reference cell 121 are in a mirrored relationship. The current source 1221 includes a PMOS transistor M1. The source of the PMOS transistor M1 is coupled to a first reference voltage VDD, the gate of the PMOS transistor M1 is coupled to the first control voltage VBP output from the reference cell 121, and the drain of the PMOS transistor M1 is coupled to the latch switch 1222. The first control voltage VBP controls the current to pass through the PMOS transistor M1.

In the embodiment, the latch switch 1222 includes a PMOS transistor M2, a PMOS transistor M3, an NMOS transistor M4, an NMOS transistor M5, a first inverter N1, and a second inverter N2. The source of the PMOS transistor M2 and that of the PMOS transistor M3 are both coupled to the drain of the PMOS transistor M1. The drain of the PMOS transistor M2 is coupled to the gate of the PMOS transistor M3. The drain of the PMOS transistor M2 and the drain of the PMOS transistor M3 are both coupled to the resistance-control component 1223. The drain of the NMOS transistor M4 is coupled to the drain of the PMOS transistor M2. The drain of the NMOS transistor M5 is coupled to the drain of the PMOS transistor M3. The gate of the NMOS transistor M4 is coupled to the output node of the second inverter N2. The gate of the NMOS transistor M5 is coupled to the output node of the first inverter N1. The source of the NMOS transistor M4 and the source of the NMOS transistor M5 are coupled to the ground. The input node of the first inverter N1 and the output node D1 (see FIG. 1) of the decoder 11 are coupled, and the output node of the first inverter N1 and the input node of the second inverter N2 are coupled.

In other embodiments, the first and second inverters N1 and N2 may be replaced by other implementations by persons having ordinary skill in the art. For example, a single inverter with an input node coupled to the output node D1 of the decoder 11, an output node coupled to the gate of the NMOS transistor M4, and the input node also coupled to the gate of the NMOS transistor M5.

In the present embodiment, the resistance-control component 1223 includes an NMOS transistor M6 and an NMOS transistor M7. The drain of the NMOS transistor M6 is coupled to the drain of the PMOS transistor M2. The drain of the NMOS transistor M7 is coupled to the drain of the PMOS transistor M3. The gate of the NMOS transistor M6 and the gate of the NMOS transistor M7 are coupled to the second control voltage VBR output from the reference cell 121. The source of the NMOS transistor M6 and the source of the NMOS transistor M7 are coupled the second reference voltage VSS. The second control voltage VBR is used to control an equivalent resistance of the NMOS transistor M6 and NMOS transistor M7.

The operation principle of the main cell 122 is detailed as follows.

When the output node D1 of the decoder 11 outputs a voltage level as "0", the first inverter N1 can output a signal "1" at the output node and the second inverter N2 can output a signal "0" at the output node. This renders the PMOS transistor M3 and the NMOS transistor M4 both opened, the PMOS transistor M2 and the NMOS transistor M5 both closed, and the main cell 122 outputting a signal "1" at the output node QN and a signal "0" at the output node QP.

When the output node D1 of the decoder 11 outputs a voltage level as "1", the first inverter N1 can output a signal "0" at the output node and the second inverter N2 can output a signal "1" at the output node. This renders the PMOS transistor M3 and the NMOS transistor M4 both closed, the PMOS transistor M2 and the NMOS transistor M5 both opened, and the main cell 122 outputting a signal "0" at the output node QN and a signal "0" at the output node QP.

Herein, the first node of the PMOS transistor is defined to be the source, the second node the PMOS transistor is defined to be the gate, and the third node the PMOS transistor is defined to be the drain. Furthermore, the first node of the NMOS transistor is defined to be the drain thereof, the second node the NMOS transistor is defined to be the gate thereof, and the third node the NMOS transistor is defined to be the source thereof.

Figure 5:
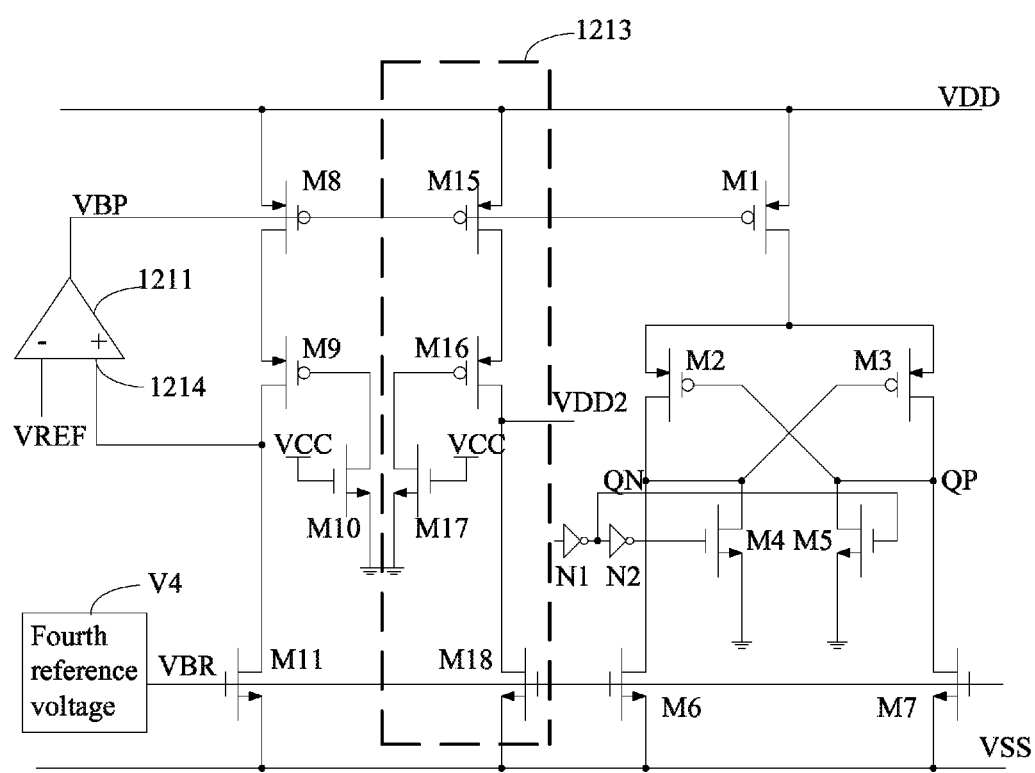
FIG. 5 illustrates a circuit schematic of the switch-driving circuit of FIG. 3 according to an embodiment of the invention.

FIG. 5 illustrates a circuit schematic of the switch-driving circuit in FIG. 3 according to an embodiment of the invention. As shown in FIG. 5, the loop 1212 is a first negative loop, including a PMOS transistor M8, a PMOS transistor M9, and an NMOS transistor M10. The source of the PMOS transistor M8 is coupled to the first reference voltage VDD, the gate of the PMOS transistor M8 is coupled to the output node of the operational amplifier 1211, and the drain of the PMOS transistor M8 is coupled to the source of the PMOS transistor M9. The drain of the PMOS transistor M9 is coupled to the second input node 1214 of the operational amplifier 1211, the gate of the PMOS transistor M9 is coupled to the drain of the NMOS transistor M10, and the gate of the NMOS transistor M10 is coupled to a third reference voltage VCC. The source of the NMOS transistor M10 is coupled to the ground, and the output node of the operational amplifier 1211 outputs the first control voltage VBP.

In the embodiment, the reference cell 121 includes an NMOS transistor M11. The drain of the NMOS transistor M11 is coupled to the drain of the PMOS transistor M9, the gate of the NMOS transistor M11 is coupled to a fourth reference voltage V4, and the source of the NMOS transistor M11 is coupled to the second control voltage VSS. The second control voltage VBR is obtained according to the fourth reference voltage V4.

Further, the reference cell 121 also includes a testing network 1213 which comprises a PMOS transistor M15, a PMOS transistor M16, an NMOS transistor M17, and an NMOS transistor M18. The source of the PMOS transistor M15 is coupled to the first reference voltage VDD, the gate of the PMOS transistor M15 is coupled to the output node of the operational amplifier 1211, and the drain of the PMOS transistor M15 is coupled to the source of the PMOS transistor M16. The gate of the PMOS transistor M16 is coupled to the drain of the NMOS transistor M17, the gate of the NMOS transistor M17 is coupled to the third reference voltage VCC, and the source of the NMOS transistor M17 is coupled to the ground. The drain of the NMOS transistor M18 is coupled to the drain of the PMOS transistor M16, the gate of the NMOS transistor M18 is coupled to the fourth reference voltage V4, and the source of the NMOS transistor M18 is coupled to the second reference voltage VSS.

The switch-driving circuit in the embodiment also includes the main cell 122. The description therefore can be found in the preceding section and will not be repeated here. The gate of the PMOS transistor M1 in the main cell 122 is coupled to the output node of the operational amplifier 1211 to obtain the first control voltage VBP. The gate of the NMOS transistor M6 and the gate of the NMOS transistor M7 are coupled to the fourth reference voltage V4 to obtain the second control voltage VBR.

The operation principle of the reference cell 121 and the first negative loop are detailed as follows.

When the third reference voltage VCC is a predetermined voltage, such as when the voltage VCC is 1.2V, the NMOS transistor M10 and the NMOS transistor M17 are turned on, and the PMOS transistor M8, the PMOS transistor M9, and the NMOS transistor M11 are also turned on. It should be understood that the predetermined value of the voltage VCC may vary with different applications and implementations. When the voltage at the second input node 1214 of the operational amplifier 1211 increases, the first control voltage VBP output from the output node of the operational amplifier 1211 increases accordingly, thereby decreasing the voltage at the gate of the PMOS transistor M8 and the current passing through the PMOS transistor M8, the PMOS transistor M9, and the NMOS transistor M11. As a result, the voltage of the NMOS transistor M11 is declined, thereby reducing the voltage at the second input node 1214 of the operational amplifier 1211. This traces the target reference voltage VREF at the second input node 1214 of the operational amplifier 1211, and in turn, adjusts the first control voltage VBP output by the operational amplifier 1211. The output voltage VDD2 at the output node of the testing network 1213 can promptly detect the voltage output by the switch-driving circuit. The preferred value of the voltage VDD2 equals the target reference voltage VREF.

The reference cell 121 and the main cell 122 in the switch-driving circuit in the embodiments are realized via the MOS transistors, obviating the need to use capacitor components, which occupy an increased area on the integrated circuit, and thereby reducing the circuit area of the switch-driving circuit. Further, since the DAC 10 includes a number of main cells 122, the reduced circuit area for each main cell 122 can amount to a considerable reduction in the circuit area of the DAC 10, increasing the integrity of the circuit, reducing the occupied area of the integrated circuit, and thereby decreasing the manufacturing costs.

Figure 6:
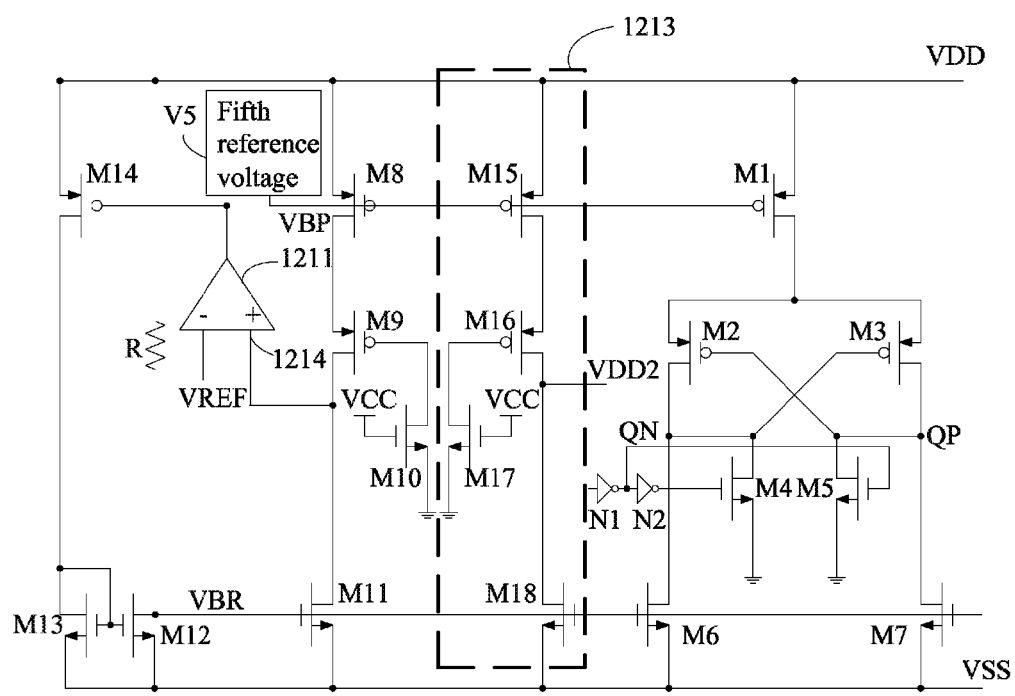
FIG. 6 depicts a circuit schematic of the switch-driving circuit of FIG. 3 according to another embodiment of the invention.

FIG. 6 depicts a circuit schematic of the switch-driving circuit according to another embodiment of the invention, in which the loop 1212 is a second negative loop which includes an NMOS transistor M11, an NMOS transistor M12, an NMOS transistor M13, a PMOS transistor M14, and a resistor R. The source of the PMOS transistor M14 is coupled to the first reference voltage VDD, the gate of the PMOS transistor M14 is coupled to the output node of the operational amplifier 1211, and the drain of the PMOS transistor M14 is coupled to the drain of the NMOS transistor M13. The gate of the NMOS transistor M13 is coupled to the gate of the NMOS transistor M12, and the drain and the gate of the NMOS transistor M13 are coupled. The source of the NMOS transistor M13, the source of the NMOS transistor M12, and the source of the NMOS transistor M11 are coupled to the second reference voltage VSS. The drain of the NMOS transistor M12 is coupled to the gate of the NMOS transistor M11, and the drain of the NMOS transistor M11 is coupled to the second input node 1214 of the operational amplifier 1211. One end of the resistor R is coupled to the first reference voltage VDD, and the other end of the resistor R is coupled to the drain of the NMOS transistor M12. The node connected to the drain of the NMOS transistor M12 and the resistor R outputs the second control voltage VBR.

In the embodiment, the reference cell 121 can further include: a PMOS transistor M8, a PMOS transistor M9, and an NMOS transistor M10. The source of the PMOS transistor M8 is coupled to the first reference voltage VDD. The gate of the PMOS transistor M8 is coupled to a fifth reference voltage V5, and the drain of the PMOS transistor M8 is coupled to the source of the PMOS transistor M9. The gate of the PMOS transistor M9 is coupled to the drain of the NMOS transistor M10. The drain of the PMOS transistor M9 is coupled to the second input node 1214 of the operational amplifier 1211. The gate of the NMOS transistor M10 is coupled to the third reference voltage VCC, and the source of the NMOS transistor M10 is coupled to the ground. The first control voltage VBP is acquired from the fifth reference voltage V5.

Moreover, the reference 121 can include the testing network 1213, which is identical to the testing network in FIG. 5, and details therefore can be referenced in the preceding section and are not repeated here. The gate of the PMOS transistor M15 is coupled to the fifth reference voltage V5, and the gate of the NMOS transistor M18 is coupled to the gate of the NMOS transistor M11.

The switch-driving circuit can further include the main cell 122, which is identical to those main cells described in the preceding sections, and therefore the details are omitted here for brevity. Herein, the gate of the PMOS transistor M1 is coupled to the fifth reference voltage V5 to obtain the first control voltage VBP. The gate of the NMOS transistor M6, the gate of the NMOS transistor M7, and the gate of the NMOS transistor M11 are coupled together to obtain the second control voltage VBR.

The operation principle of the second negative loop is detailed as follows.

When the first control voltage VBP output from the operational amplifier 1211 increases, the currents through the PMOS transistor M14, the NMOS transistor M13, and the NMOS transistor M12 decrease accordingly, resulting in an decreased voltage on the resistor R and the second control voltage VBR increasing. This leads to a reduced voltage at the second input node 1214 of the operational amplifier 1211 and enable the voltage at the second input node 1214 of the operational amplifier 1211 to track the target reference voltage VREF, thereby adjusting the first control voltage VBP output at the output node of the operational amplifier 1211. The output node of the testing network 1213 can output the voltage VDD2, promptly detecting the output voltage of the switch-driving circuit. The preferred value for the voltage VDD2 is equal to the target reference voltage VREF.

Figure 7:
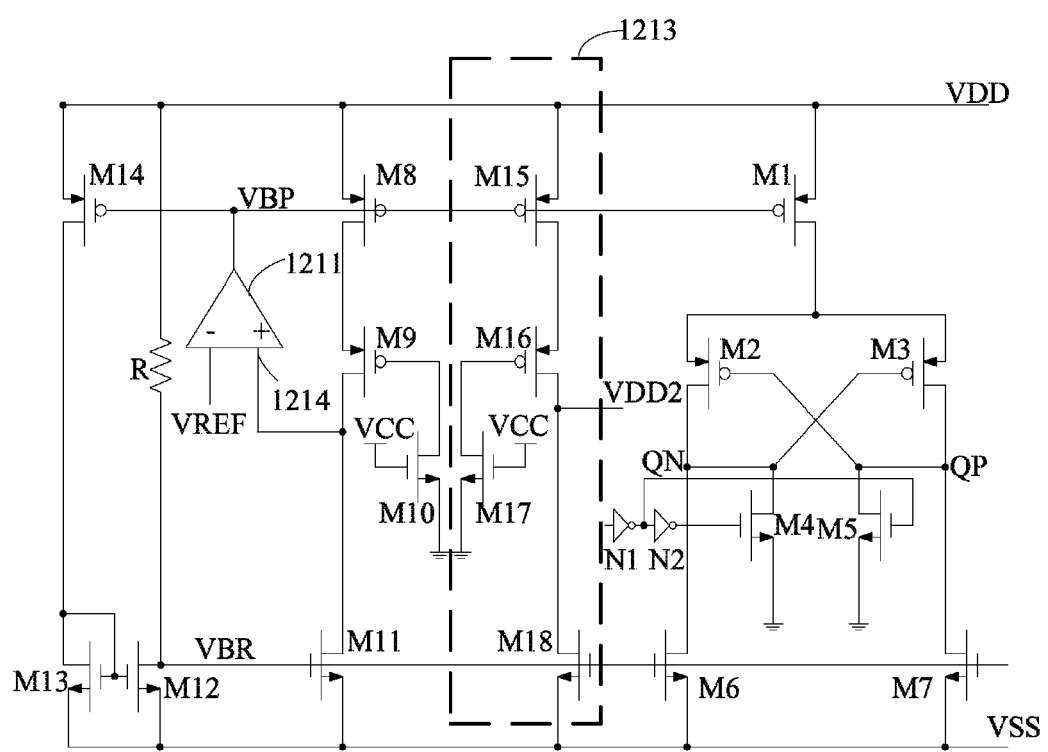
FIG. 7 shows a circuit schematic of the switch-driving circuit of FIG. 3 according to one another embodiment of the invention.

As shown in FIG. 7, which depicts a circuit schematic of the switch-driving circuit according to another embodiment of the invention, the loop 1212 in this embodiment includes the first negative loop and the second negative loop mentioned above. The first negative loop and the second negative loop here form two loops to lock the voltage at the second input node 1214 of the operational amplifier 1211 to the target reference voltage VREF.

In the embodiment, the first negative feedback circuit includes a PMOS transistor M8, a PMOS transistor M9, and an NMOS transistor M10. The source of the PMOS transistor M8 is coupled to the first reference voltage VDD, the gate of the PMOS transistor M8 is coupled to the output node of the operational amplifier 1211, and the drain of the PMOS transistor M8 is coupled to the source of the PMOS transistor M9. The drain of the PMOS transistor M9 is coupled to the second input node 1214 of the operational amplifier 1211, and the gate of the PMOS transistor M9 is coupled to the drain of the NMOS transistor M10. The gate of the NMOS transistor M10 is coupled to the third reference voltage VCC, and the source of the NMOS transistor M10 is coupled to the ground. The output node of the operational amplifier 1211 outputs the first control voltage VBP.

In the embodiment, the second negative loop includes an NMOS transistor M11, an NMOS transistor M12, an NMOS transistor M13, a PMOS transistor M14, and a resistor R. The source of the PMOS transistor M14 is coupled to the first reference voltage VDD, the gate of the PMOS transistor M14 is coupled to the output node of the operational amplifier 1211, and the drain of the PMOS transistor M14 is coupled to the drain of the NMOS transistor M13. The gate of the NMOS transistor M13 is coupled to the gate of the NMOS transistor M12, the drain and the gate of the NMOS transistor M13 are coupled together. The source of the NMOS transistor M13, the source of the NMOS transistor M12, and the source of the NMOS transistor M11 are coupled to the second reference voltage VSS. The drain of the NMOS transistor M12 is coupled to the gate of the NMOS transistor M11, and the drain of the NMOS transistor M11 is coupled to the second input node 1214 of the operational amplifier 1211. One end of the resistor R is coupled to the first reference voltage VDD, and the other end of the resistor R is coupled to the drain of the NMOS transistor M12. The node connected to the drain of the NMOS transistor M12 and the resistor R outputs the second control voltage VBR.

Further, the reference 121 can include a testing network 1213 identical to the testing network in FIG. 5. Details can therefore be found referenced in the preceding section and shall not be repeated here. Herein, the gate of the PMOS transistor M15 is coupled to the output node of the operational amplifier 1211, and the gate of the NMOS transistor M18 is coupled to the gate of the NMOS transistor M11.

The switch-driving circuit can further include a main cell 122 identical to those main cells described in the preceding sections, and for the sake of brevity, the details thereof shall not be repeated here. Herein, the gate of the PMOS transistor M1 is coupled to the output node of the operational amplifier 1211 to obtain the first control voltage VBP. The gate of the NMOS transistor M6, the gate of the NMOS transistor M7, and the gate of the NMOS transistor M11 are coupled together to obtain the second control voltage VBR. If the voltage at the second input node 1214 of the operational amplifier 1211 is higher than the target reference voltage VREF, the first control voltage VBP goes high and the current through the PMOS transistor M14 and the NMOS transistor M11 is decreased. Therefore the voltage at the second input node 1214 is pulled back. Meanwhile, the first control voltage VBP going high also reduces the current in the NMOS transistor M13. So current mirror consist of the NMOS transistor M13 and the NMOS transistor M12 outputs the reduced current leading to the decreasing of the second control voltage VBR of the NMOS transistor M11. Herein, the NMOS transistor M11 acts as an active resistor. This also will pull the voltage at the second input node 1214 to a lower voltage level.

In comparison to the embodiments in FIG. 5 and FIG. 6, the embodiment in FIG. 7 is distinct at the switch-driving circuit which includes two negative loops, since a value of power supply rejection (PSR) of an operational amplifier (OP) for the switch-driving circuit of FIG. 7 is greater than that of the switch-driving circuits in FIG. 5 and FIG. 6. In detail, the PSR for the switch-driving circuit of FIG. 7 reflects the power noise immunization ability of the switch-driving circuit, and can be calculated by the following formula:

$$PSR = \frac{v_{dd2}}{v_{dd}} = \frac{1}{PSRR_{OP}} \cdot \frac{(A_{v1} + A_{v2})A_{v,OP}}{(A_{v1} + A_{v2})A_{v,OP} + 1}.$$

Wherein, $PSRR_{OP}$ represents the power supply rejection ratio of the OP, $A_{v,op}$ represents the DC gain of the OP, $A_{v1}$ represents the DC gain of the first negative loop, and $A_{v2}$ represents the DC gain of the second negative loop.

$$\text{Since: } \frac{(A_{v1} + A_{v2}) \cdot A_{v,OP}}{(A_{v1} + A_{v2}) \cdot A_{v,OP} + 1} > \frac{A_{v1} \cdot A_{v,OP}}{A_{v1} \cdot A_{v,OP} + 1} \text{ or } \frac{A_{v2} \cdot A_{v,OP}}{A_{v1} \cdot A_{v,OP} + 1}$$

the PSR for the switch-driving circuit of FIG. 7 is better than that of the only first negative loop and the only second negative loop. As such, the voltage signals at the two output nodes QN and QP is purer and has less noisy, thereby improving the performance of the DAC 10.

In the other embodiments of the invention, persons with ordinary skill in the art may utilize the NMOS transistors to replace one or more of the PMOS transistors and vise versa.

The switch-driving circuit in the embodiments employs MOS transistors to realize the reference cell and the main cell, preventing from using capacitor components which occupy an increased circuit area, thereby reducing the circuit area of the switch-driving circuit. Further, since the DAC 10 includes a number of main cells 122, the reduced circuit area for each main cell 122 can amount to a considerable reduction in the circuit area of the DAC 10, increasing the integrity of the circuit, reducing the occupied area of the integrated circuit, and thereby decreasing manufacturing costs for the DAC 10. Contrary to the operation mechanism of using the LDO to provide the operation voltage VDD2, by applying current through the resistance-control component and providing the current source through the reference cell and the control voltage signal through the resistance-control component, the switch-driving circuits in the embodiments implement an operation mechanism which generates the required operation voltage, rendering the voltage signals output by the switch-driving circuit purer and less noisy, and increasing the performance of the DAC 10.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or any other programmable logic device, discrete gate or transistor logic, discrete hardware components, or any combination thereof designed to perform the functions described herein. A general purpose processor may be a microprocessor, but in the alternative, the processor may be any commercially available processor, controller, microcontroller, or state machine.

The operations and functions of the various logical blocks, modules, and circuits described herein may be implemented in circuit hardware or embedded software codes that can be accessed and executed by a processor.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A switch-driving circuit, coupled between a first reference voltage and a second reference voltage, comprising:
    a main cell, comprising a current source and a resistance-control component electronically connected to the current source; and
    a reference cell, coupled to the current source and the resistance-control component, comprising a first loop configured to track a target reference voltage so as to provide at least one first control voltage to control a resistance change of the resistance-control component, wherein the first loop comprises:
    an operational amplifier with a first input node for receiving the target reference voltage, a second input node, and an output node;
    an eleventh MOS transistor, comprising a first node, a second node, and a third node, wherein the first node is coupled to the second input node of the operational amplifier, and the third node is coupled to the second reference voltage;
    a twelfth MOS transistor, comprising a first node, a second node, and a third node, wherein the first node is coupled to the second node of the eleventh MOS transistor, and the third node is coupled to the second reference voltage;
    a thirteenth MOS transistor, comprising a first node, a second node, and a third node, wherein the first node and the second node are both coupled to the second node of the twelfth MOS transistor, and the third node is coupled to the second reference voltage; and
    a fourteenth MOS transistor, comprising a first node coupled to the first reference voltage, a second node coupled to the output node of the operational amplifier, and a third node coupled to the first and second nodes of the thirteenth MOS transistor.

2. The switch-driving circuit of claim 1, wherein the current source comprises a first MOS transistor, comprising a first node coupled to a first reference voltage, and a second node coupled to the first control voltage from the reference cell, wherein a current of the current source has a mirrored relationship with a current output by the reference cell.

3. The switch-driving circuit of claim 2, wherein the main cell comprises a latch switch coupled in series between the current source and the resistance-control component; and the latch switch comprises a second MOS transistor, a third MOS transistor, a fourth MOS transistor and a fifth MOS transistor, wherein a first node of the second MOS transistor, a first node of the third MOS transistor and a third node of the first MOS transistor are coupled together; a second node of the second MOS transistor, a third node of the third MOS transistor and a first node of the fifth MOS transistor are coupled together; a third node of the second MOS transistor, a second node of the third MOS transistor and a first node of the fourth MOS transistor are coupled together; a third node of the second MOS transistor, a third node of the third MOS transistor are coupled to the resistance-control component, and a third node of the fourth MOS transistor and a third node of the fifth MOS transistor are coupled to ground.

4. The switch-driving circuit of claim 3, wherein the latch switch further comprises:
    a first inverter, comprising an input node for receiving a voltage signal, and an output node; and
    a second inverter, comprising an input node and an output node, wherein the output node of the first inverter is coupled to the input node of the second inverter and a second node of the fifth MOS transistor, and the output node of the second inverter is coupled to a second node of the fourth MOS transistor.

5. The switch-driving circuit of claim 3, wherein the resistance-control component comprises:
    a sixth MOS transistor, comprising a first node coupled to a third node of the second MOS transistor, a second node coupled to a second control voltage output from the reference cell, and a third node coupled to a second reference voltage; and
    a seventh MOS transistor, comprising a first node coupled to a third node of the third MOS transistor, a second node coupled to the second node of the sixth MOS transistor, and a third node coupled to the second reference voltage.

6. The switch-driving circuit of claim 5, wherein the reference cell further comprises:
    an eighth MOS transistor, comprising a first node coupled to the first reference voltage, a second node coupled to a fifth reference voltage, and a third node;
    a ninth MOS transistor, comprising a first node, a second node, and a third node, wherein the first node of the ninth MOS transistor is coupled to the third node of the eighth MOS transistor, and the third node of the ninth MOS transistor is coupled to the second input node of the operational amplifier and the first node of the eleventh MOS transistor; and
    a tenth MOS transistor, comprising a first node coupled to the second node of the ninth MOS transistor, a second node coupled to a third reference voltage, and a third node coupled to the ground.

7. The switch-driving circuit of claim 6, wherein the second node of the first MOS transistor is coupled to fifth reference voltage through the eighth MOS transistor, and the second node of the sixth MOS transistor is coupled to the second node of the eleventh MOS transistor.

8. The switch-driving circuit of claim 6, wherein the first MOS transistor, the second MOS transistor, the third MOS transistor, the eighth MOS transistor, the ninth MOS transistor, and the fourteenth MOS transistor are PMOS transistors, wherein the first node of each PMOS transistor is a source, the second node of each PMOS transistor is a gate, and the third node of each PMOS transistor is a drain, and the fourth MOS transistor, the fifth MOS transistor, the sixth MOS transistor, the seventh MOS transistor, the tenth MOS transistor, the eleventh MOS transistor, the twelfth MOS transistor, and the thirteenth MOS transistor are NMOS transistors, wherein the first node of each NMOS transistor is a drain, the second node of each NMOS transistor is a gate, and the third node of each NMOS transistor is a source.

9. The switch-driving circuit of claim 6, wherein the first MOS transistor, the second MOS transistor, the third MOS transistor, the eighth MOS transistor, the ninth MOS transistor, and the fourteenth MOS transistor have substantially a same parameter and a same transistor type, while the fourth MOS transistor, the fifth MOS transistor, the sixth MOS transistor, the seventh MOS transistor, the tenth MOS transistor, the eleventh MOS transistor, the twelfth MOS transistor, and the thirteenth MOS transistor have substantially another same parameter and are substantially a same transistor type.

10. The switch-driving circuit of claim 6, wherein the first MOS transistor, the second MOS transistor, the third MOS transistor, the eighth MOS transistor and, the ninth MOS transistor and the fourteenth MOS transistor are PMOS transistors, wherein the first node of each PMOS transistor is a source, the second node of each PMOS transistor is a gate, the third node of each PMOS transistor is a drain, and the fourth MOS transistor, the fifth MOS transistor, the sixth MOS transistor, the seventh MOS transistor, the tenth MOS transistor, the eleventh MOS transistor, the twelfth MOS transistor and the thirteenth MOS transistor are NMOS transistors, wherein the first node of each NMOS transistor is a drain, the second node of each NMOS transistor is a gate, and the third node of each NMOS transistor is a source.

11. The switch-driving circuit of claim 5, wherein the reference cell further comprises a second loop comprising:
an eighth MOS transistor, comprising a first node coupled to the first reference voltage, a second node coupled to the output node of the operational amplifier, and a third node;
a ninth MOS transistor, comprising a first node, a second node, and a third node, wherein the first node of the ninth MOS transistor is coupled to the third node of the eighth MOS transistor, and the third node of the ninth MOS transistor is coupled to the second input node of the operational amplifier and the first node of the eleventh MOS transistor; and
a tenth MOS transistor, comprising a first node coupled to the second node of the ninth MOS transistor, a second node coupled to a third reference voltage, and a third node coupled to the ground.

12. The switch-driving circuit of claim 11, wherein the first MOS transistor, the second MOS transistor, the third MOS transistor, the eighth MOS transistor, the ninth MOS transistor, and the fourteenth MOS transistor have substantially a same parameter and a same transistor type, while the fourth MOS transistor, the fifth MOS transistor, the sixth MOS transistor, the seventh MOS transistor, the tenth MOS transistor, the eleventh MOS transistor, the twelfth MOS transistor, and the thirteenth MOS transistor have substantially a same parameter and a same transistor type.

13. The switch-driving circuit of claim 12, wherein the first MOS transistor, the second MOS transistor, the third MOS transistor, the eighth MOS transistor, the ninth MOS transistor, and the fourteenth MOS transistor are PMOS transistors, wherein the first node of each PMOS transistor is a source, the second node of each PMOS transistor is a gate, the third node of each PMOS transistor is a drain, while the fourth MOS transistor, the fifth MOS transistor, the sixth MOS transistor, the seventh MOS transistor, the tenth MOS transistor, the eleventh MOS transistor, the twelfth MOS transistor and the thirteenth MOS transistor are NMOS transistors, wherein the first node of each NMOS transistor is a drain, the second node of each NMOS transistor is a gate, and the third node of each NMOS transistor is a source.

14. The switch-driving circuit of claim 11, wherein the second node of the first MOS transistor is coupled to the output node of the operational amplifier, and the second node of the sixth MOS transistor is coupled to the second node of the eleventh MOS transistor.

15. The switch-driving circuit of claim 1, wherein the first loop comprises:
a resistor, comprising one end coupled to the first node of the twelfth MOS transistor, and the other end coupled to the first reference voltage.

16. The switch-driving circuit of claim 1, wherein the reference cell further comprises a testing network, wherein the testing network comprises a fifteenth transistor, a sixteenth transistor, a seventeenth transistor, and an eighteenth transistor, the source of the fifteenth transistor is coupled to the first reference voltage, the gate of the fifteenth transistor is coupled to the output node of the operational amplifier, and the drain of the fifteenth transistor is coupled to the source of the sixteenth transistor, the gate of the sixteenth transistor is coupled to the drain of the seventeenth transistor, the gate of the seventeenth transistor is coupled to a third reference voltage, and the source of the seventeenth transistor is coupled to the ground, the drain of the eighteenth transistor is coupled to the drain of the sixteenth transistor, the gate of the eighteenth transistor is coupled to a fourth reference voltage, and the source of the eighteenth transistor is coupled to the second reference voltage.

17. A Digital-to-Analog Converter, comprising a decoder and a switch-driving circuit connected thereto, wherein the switch-driving circuit is coupled between a first reference voltage and a second reference voltage, and comprises:
a main cell, comprising a current source and a resistance-control component electronically connected to the current source; and
a reference cell, coupled to the current source and the resistance-control component, comprising a loop configured to track a target reference voltage so as to provide at least one first control voltage to control a resistance change of the resistance-control component, the loop comprises a first negative loop comprising:
an operational amplifier with a first input node for receiving the target reference voltage, a second input node, and an output node;
an eleventh MOS transistor, comprising a first node, a second node, and a third node, wherein the first node is coupled to the second input node of the operational amplifier, and the third node is coupled to the second reference voltage;
a twelfth MOS transistor, comprising a first node, a second node, and a third node, wherein the first node is coupled to the second node of the eleventh MOS transistor, and the third node is coupled to the second reference voltage;
a thirteenth MOS transistor, comprising a first node, a second node, and a third node, wherein the first node and the second node are both coupled to the second node of the twelfth MOS transistor, and the third node is coupled to the second reference voltage; and
a fourteenth MOS transistor, comprising a first node coupled to the first reference voltage, a second node coupled to the output node of the operational amplifier, and a third node coupled to the first and second nodes of the thirteenth MOS transistor.

18. The Digital-to-Analog Converter of claim 17, wherein the the loop is connected between the output node of the operational amplifier and the second input node of the operational amplifier, and comprises at least one of the first negative loop and a second negative loop, wherein the second negative loop comprises:
- an eighth MOS transistor, comprising a first node coupled to the first reference voltage, a second node coupled to the output node of the operational amplifier, and a third node;
- a ninth MOS transistor, comprising a first node, a second node, and a third node, wherein the first node of the ninth MOS transistor is coupled to the third node of the eighth MOS transistor, and the third node of the ninth MOS transistor is coupled to the second input node of the operational amplifier and the first node of the eleventh MOS transistor; and
- a tenth MOS transistor, comprising a first node coupled to the second node of the ninth MOS transistor, a second node coupled to a third reference voltage, and a third node coupled to the ground.

19. A switch-driving circuit, coupled between a first reference voltage and a second reference voltage, comprising:
- a main cell, comprising a current source and a resistance-control component electronically connected to the current source; and
- a reference cell, coupled to the current source and the resistance-control component, comprising a first loop configured to track a target reference voltage so as to provide at least one first control voltage to control a resistance change of the resistance-control component, wherein the first loop comprises:
- an operational amplifier with a first input node for receiving the target reference voltage, a second input node, and an output node;
- an eighth MOS transistor, comprising a first node coupled to the first reference voltage, a second node coupled to the output node of the operational amplifier, and a third node;
- a ninth MOS transistor, comprising a first node coupled to the third node of the eighth MOS transistor, a second node, and a third node coupled to the second input node of the operational amplifier; and
- a tenth MOS transistor, comprising a first node coupled to the second node of the ninth MOS transistor, a second node coupled to a third reference voltage, and a third node coupled to the ground.

* * * * *